United States Patent [19]
Hulsing, II

[11] Patent Number: 5,500,627
[45] Date of Patent: Mar. 19, 1996

[54] PRECISION DUTY CYCLE PHASE LOCK LOOP

[75] Inventor: Rand H. Hulsing, II, Redmond, Wash.

[73] Assignee: AlliedSignal Inc., Morristown, N.J.

[21] Appl. No.: 184,090

[22] Filed: Jan. 19, 1994

[51] Int. Cl.[6] .................................................. H03K 9/06
[52] U.S. Cl. ........................ 331/1 A; 331/23; 331/25; 324/76.48; 329/319; 329/343; 327/175; 327/176; 327/141; 327/184; 327/159; 327/160
[58] Field of Search ................................ 329/312, 325, 329/343, 315, 318, 319, 323, 341; 331/1 A, 25, 23; 328/58, 155; 307/265; 327/151, 156, 159, 160, 172, 175, 176, 184, 141; 377/48, 49; 324/76.48, 76.52, 76.53, 76.62

[56] References Cited

U.S. PATENT DOCUMENTS

| | | | |
|---|---|---|---|
| 3,579,146 | 5/1971 | Paine | 329/312 X |
| 4,134,081 | 1/1979 | Pittaro | 331/1 A |
| 4,144,489 | 3/1979 | Ward et al. | 331/1 A |
| 4,345,211 | 8/1982 | Longworth | 328/155 X |
| 4,475,086 | 10/1984 | Allen | 327/175 X |
| 4,713,832 | 12/1987 | Hutson | 377/45 |
| 5,040,197 | 8/1991 | Theobald | 377/48 |
| 5,095,264 | 3/1992 | Hulsing, II | 324/76.48 X |

Primary Examiner—Robert J. Pascal
Assistant Examiner—Arnold Kinkead

[57] ABSTRACT

An up/down counter within a phase locked loop is gated to count high frequency clock pulses during the first cycle of the input signal. Upon detection of a transition in the input signal indicating the end of the first cycle, the direction of the count is reversed until the count is reduced to zero, thereby assuring equal widths for the first and second half cycles of each output cycle. The system may be implemented with or without a voltage controlled oscillator. In the latter implementation, the count in the up/down counter at the time of a reversal in the count direction is compared with the count in a preset counter. A difference counter compares the differences in a count in the two counters and adjusts the count in the preset counter to match that in the up/down counter at the time of transition. The widths of the successive cycles, rather than half cycles, may be made by doubling the output frequency relative to the input frequency.

14 Claims, 2 Drawing Sheets

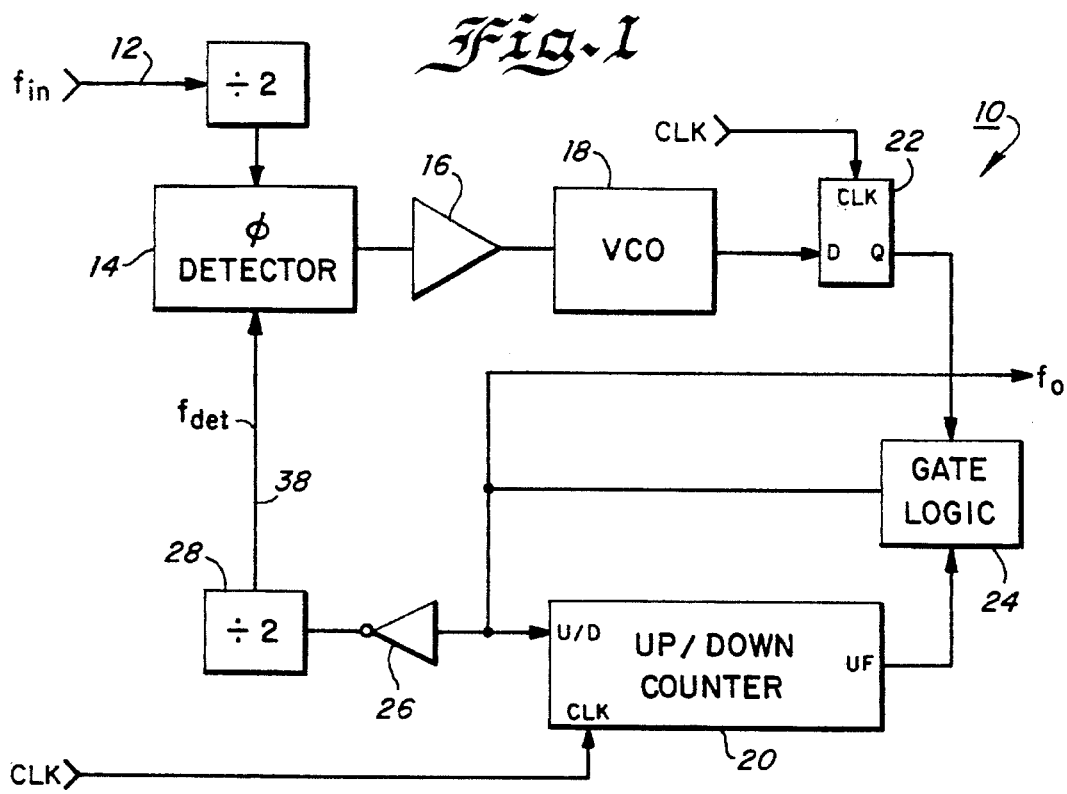
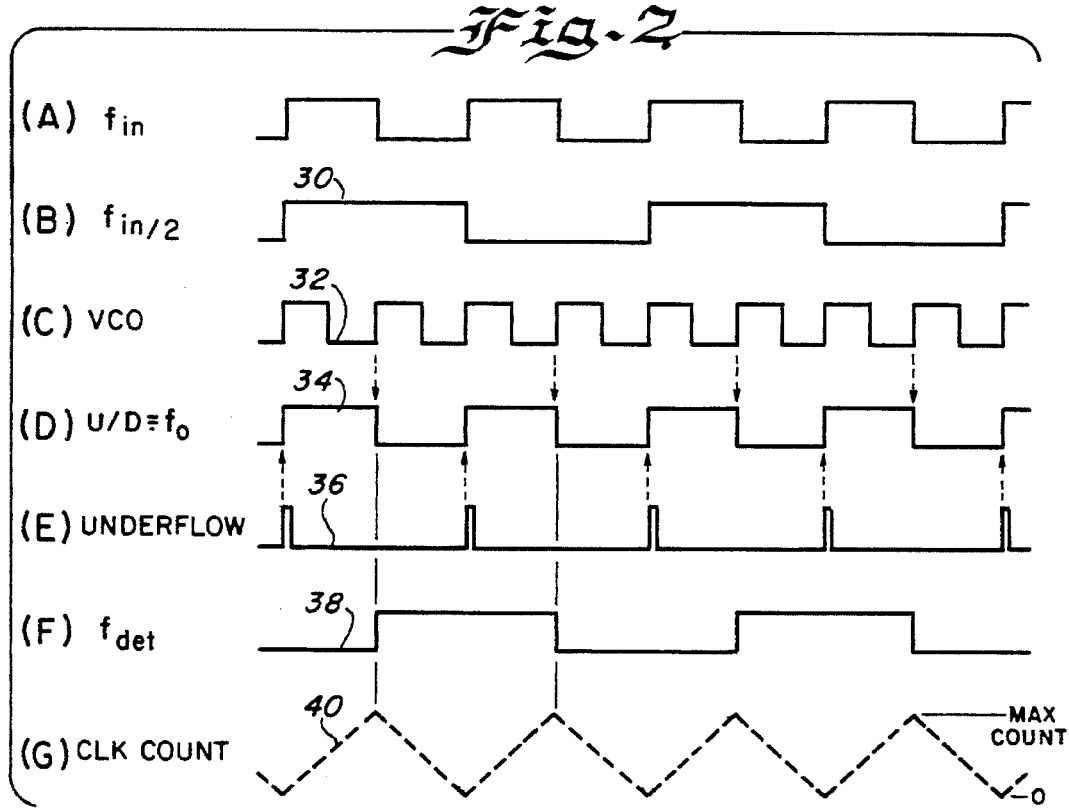

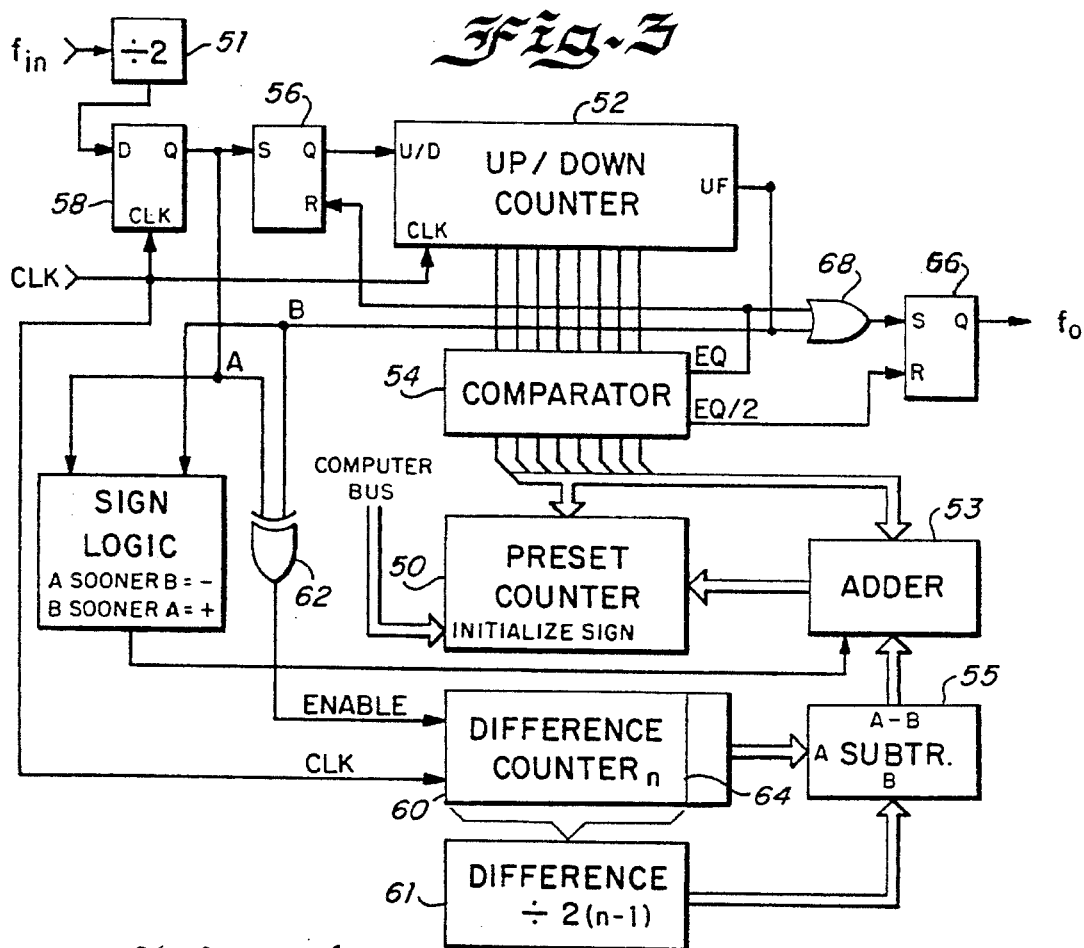
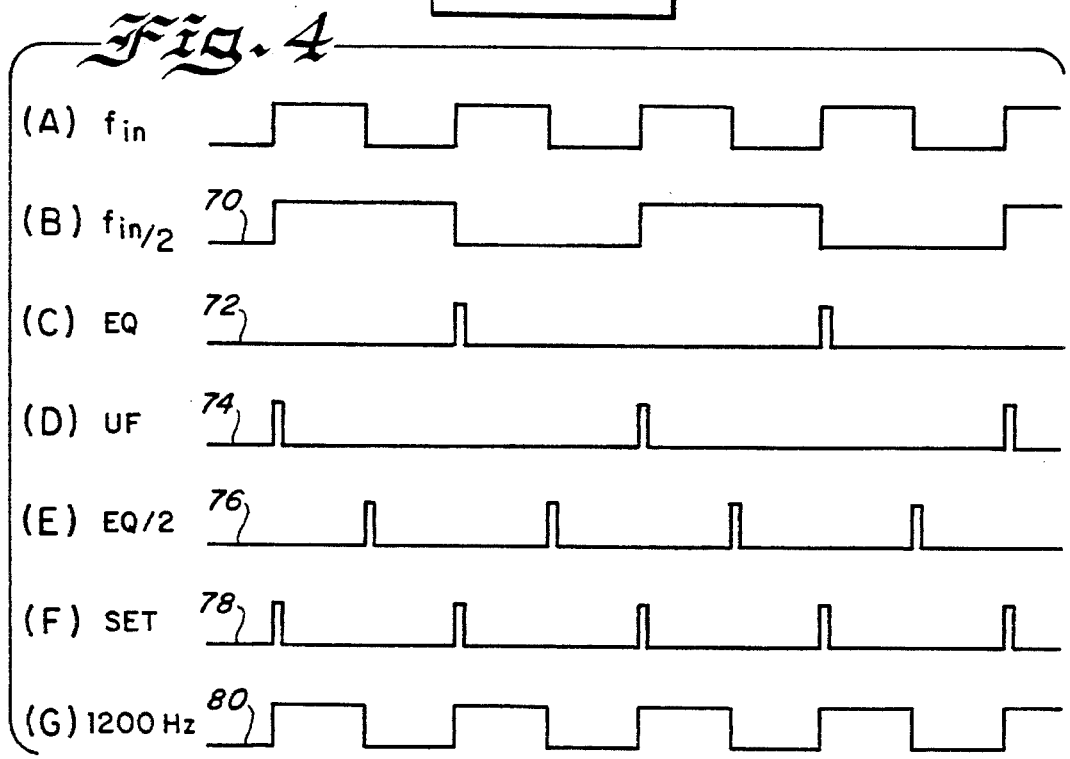

PRECISION DUTY CYCLE PHASE LOCK LOOP

BACKGROUND OF THE INVENTION

1. Field of the Invention

This invention relates generally to phase tracking devices that dynamically track the phase or frequency of an input signal within a given bandwidth as in the case of a phase lock loop. More particularly, the invention relates to a phase tracking device that maintains a constant duty cycle for the half cycles within each complete cycle despite rapid changes in the input frequency being tracked.

2. Description of the Prior Art

Various phase lock loops are known. A typical phase lock loop utilizes a voltage controllable oscillator (VC0) whose output frequency is controlled by a control voltage. A phase detector compares the phase difference between the signal from the VCO and the signal being tracked and provides an output signal proportional to the phases of the two signals. The output signal from the phase detector is applied to the frequency controlling input of the VCO and adjusts the frequency of the VCO until the phase difference between the two signals is zero or another desired value. The VCO will then track any changes in the frequency of the input signal. However, if the input frequency has a step change, the output of the phase lock loop will slew over to the new frequency with a continuously changing frequency until the loop settles. The continuously changing frequency of the phase lock loop during the slewing period will result in a waveformat the output of the phase lock loop that does not have a 50% duty cycle. For example, if the phase lock loop is being utilized as a demodulator, it is important that the phase lock loop signal applied to the phase detector and compared with the input signal have an exact 50% duty cycle. If the first half cycle is not equal to the second half cycle, then the demodulated output will contain rectified information, such as a DC offset, in addition to the desired AC signal information.

SUMMARY

It is an object of the present invention to provide a signal wherein each cycle has equal width half cycles.

It is another object of the present invention to provide a phase lock loop having a signal wherein two successive cycles are of equal width.

It is yet another object of the present invention to provide a phase lock loop type of circuit that provides a signal having equal width half cycles without the use of a voltage controlled oscillator.

In accordance with a preferred embodiment of the invention, an up/down counter is connected inside the loop of a phase lock loop. The output signal from the voltage controlled oscillator (VCO) controls a gate to the up/down counter and causes the up/down counter to count high frequency clock pulses during the first half of each cycle of the VCO output signal. When a transition in the VCO signal is detected, the counting direction of the up/down counter is reversed and the counter is allowed to count down to zero. When underflow occurs, counting is again resumed in the up direction. Consequently, since the width of the second half cycle was determined by the width of the first half cycle, the widths of the two half cycles are equal. The up/down control signal to the up/down counter is then divided by two and applied to the phase detector rather than the output of the VCO as is conventionally done. In another embodiment, the VCO is eliminated and the up/down counter is driven directly by the input signal.

BRIEF DESCRIPTION OF THE DRAWING

These and other objects and advantages of the present invention will become readily apparent upon consideration of the following detailed description and attached drawing, wherein:

FIG. 1 is a schematic block diagram of the invention;

FIG. 2 is a timing diagram illustrating the operation of the circuit of FIG. 1;

FIG. 3 is a schematic block diagram illustrating an embodiment of the invention that does not utilize a voltage controlled oscillator; and FIG. 4 is a timing diagram illustrating the operation of the circuit of FIG. 3.

DETAILED DESCRIPTION OF THE PREFERRED EMBODIMENT

Referring now to the drawing, with particular attention to FIG. 1, there is shown a block diagram of the precision duty cycle phase lock loop according to the invention generally designated by the reference numeral 10. The loop 10 includes an input port 12 for receiving an input signal dividing by 2 and applying it to a phase detector 14. The output of the phase detector 14 is applied to an amplifier 16 that amplifies the phase detector signal and applies it to a voltage controlled oscillator 18 to control the frequency of the output signal from the voltage controlled oscillator 18.

In a standard phase lock loop, the output signal from the voltage controlled oscillator 18 would be fed back to the phase detector 14 and the phase detector 14 would provide an output signal representative of the phase difference between the signal from the voltage controlled oscillator 18 and the input signal received at the input port 12. The output voltage of the phase detector would be amplified by the amplifier 16 and applied to the voltage controlled oscillator 18 to lock the phase of the output signal from the voltage controlled oscillator 18 to the phase of the signal received at the input port 12. However, such a system does not provide equal width output pulses from the VCO 18 during rapid changes or step changes in the frequency of the input signal applied to the port 12. Consequently, circuitry including a bi-directional counter, commonly known as an up/down counter, such as a counter 20, an D-flip-flop 22, gate logic 24, an inverting amplifier 26 and a divide-by-two circuit 28 are provided to equalize the half cycles. The output of the divide-by-two circuit 28, which receives the up/down commands applied to the up/down counter 20 is applied to the phase detector 14.

In operation, the output of the VCO 18 is connected to an input of the D-flip-flop 22 that synchronizes the transitions in the VCO signal to the clock signal and is used to control the gate logic circuit 24 to control the counting of clock pulses by the bi-directional or up/down counter 20. Typically, the frequency of the clock pulses is substantially higher than that of the output signal from the VCO 18, for example, the output of the VCO 18 may have an output frequency on the order of 1200 Hz while the clock frequency may be on the order of 30 MHz. The VCO controls the gate logic 24 to cause the gate logic 24 to cause the up/down counter to count clock pulses during one cycle of the VCO signal and after one cycle has been completed, to count down until an underflow signal is generated. Specifically, clock pulses are counted by the up/down counter 20 during the one full cycle from the VCO 18. The clock pulses are counted until the output of the VCO 18 completes a full cycle at which point the gate logic 24 reverses the direction of the count and the up/down counter counts down until the count is reduced to zero and underflow occurs. The underflow signal from the up/down counter 20 is then applied to the gate logic 24, which again reverses the count direction of the up/down counter 20 and the cycle is repeated. The output from the gate logic 24 that controls the direction of count of the up/down counter is a signal that has a frequency equal to the frequency of the input signal at the input port 12. This signal is inverted by the inverter 26 and divided by two by the divider 28 and applied to the phase detector 14. Thus, phase detector 14 is supplied with a signal having a 90° phase shift to align the output $f_0$ phase to the input $f_{in}$ phase, but $f_0$ has equal first and second half cycles.

It should also be noted that the up/down counter 20 can also be pre-loaded with a predetermined number that is counted down during a full cycle of the VCO signal and then counted back up to the predetermined number at which point "underflow" occurs. Thus, it should be understood that the term "underflow" is intended to cover both of the above-described cases.

The operation of the circuit of FIG. 1 is readily understood from the timing diagram of FIG. 2. The input signal to the input port 12 is illustrated as the waveform 30 of FIG. 2A. This input signal FIG. 2B is divided by 2 as shown in FIG. 2B. The VCO 18 operates at a frequency of four times that of its input signal as shown by the graph 32 in FIG. 2C. The VCO signal triggers a change in the up/down counter during each rising edge of the VCO signal as illustrated in graph 34 of FIG. 2D. The underflow signal triggers the up/down signal in the opposite direction upon each occurrence thereof as shown by the graph 36 of FIG. 2E. Thus, the up/down signal is alternately toggled by the rising edge of the VCO signal and by the underflow signal. Thus, the frequency of the up/down signal 34 is one-half the frequency of the VCO signal or twice the frequency of the VCO input signal FIG. 2B and corresponds to one complete up/down count cycle of the counter 20 as illustrated by the graph 40 in FIG. 2G. The up/down signal is then divided by two by the divider 28 and results in the $f_{det}$ signal 38 of FIG. 2F which has a frequency $f_{det}$ that is one half the frequency as the frequency of the input signal $f_{in}$ and a width corresponding to a complete up/down cycle of the counter 20.

FIG. 3 shows an equal period demodulator that provides an equal period output signal as does the circuit of FIG. 1. However, the circuit of FIG. 3 does not require a voltage controlled oscillator. The circuit of FIG. 3 operates on the principal that the approximate period of the input signal is known. A count value corresponding to this period is input into a preset counter from a stored reference count. The input signal is applied to an up/down counter that counts up during the first half cycle and counts down until underflow is achieved in the manner previously discussed. The maximum count in the up/down counter which represents the width of the first half cycle is compared with the count in the preset counter and a difference in the two counts is taken. If there is a non-zero difference, the difference is divided by two and the preset counter is adjusted by one-half the difference.

Referring to FIG. 3, a preset counter 50 is loaded with a count representative of the approximate width of one-half cycle of the input signal. The preset count may be loaded in from an external computer or may be a default condition whereby the preset counter returns to the preset count upon a reset or an interruption of power. An up/down counter 52 receives the input signal and a comparator 54 compares the counts in the counters 50 and 52. A set/reset flip-flop 56 and a D-flip-flop 58 control the application of the input signal to the up/down counter. A difference counter 60 that is enabled by an exclusive OR gate 62 takes the difference between the counts in the up/down counter 52 and the preset counter 50, divides it by two by shifting the count one stage to the right as indicated by the line 64 and stores in counter 61 (one cycle) and adjusts the preset counter 50 using adder 53 by adding the current count in 60 and subtracting one-half count (n−1) delayed in 61 to make the count in the preset counter more closely match the count in the up/down counter 52. This delayed count 61 stabilizes the preset counter value, a similar scheme may be used in the system of FIG. 1. Alternatively, one half of the full count error 60 can be added to the preset 50 while one-quarter of 60 (delay one cycle) is subtracted the next two consecutive cycles.

In operation, the input signal is applied to the divide by 2 flip-flop 51 then to the D input of the D-flip-flop 58 and upon receipt of the next clock pulse, the input signal is transferred to the Q output of the D-flip-flop 58. Thus, the function of the D-flip-flop 58 is to synchronize the input signal to the clock to permit an accurate count by the up/down counter 52. The Q output of the D flip-flop 58 is applied to the set input of the set/reset flip-flop 56. When the flip-flop 56 is set, a high appears at its Q output and the up/down counter begins to count up. The counter continues to count up until the comparator 54 indicates that the counts in the two counters are equal and resets the set/reset flip-flop 56. When the flip-flop 56 is reset, the counter 52 will begin counting down until an underflow condition is reached. If the first half cycle of the input signal is not wide enough to cause the count in the up/down counter 52 to reach the count in the preset counter 50, the direction of the count will be reversed by the transition in the input signal. The Q output of the flip-flop 66, $f_o$, has the same frequency as the input signal, $f_{in}$, but has equal period half cycles because the period of each second half cycle is determined by the maximum value of the count in the up/down counter which is in turn determined by the period of each first half cycle.

An exclusive OR gate 62 receives the Q output from the flip-flop 58 and the underflow signal from the up/down counter 52 and enables the difference counter 60 to count clock pulses during the time interval between the transition of the Q signal and the generation of the underflow signal. The count obtained in the difference counter during the time between the transition of the Q output of the flip-flop 58 and the underflow is divided by two by shifting the contents of the counter one stage to the right beyond the line 64, and a count equal to half the difference in the difference counter is applied to the delay counter 61 to adjust the count therein as described before. If the transition in the input signal is ahead of the underflow signal, the number is subtracted from the preset value. If the underflow signal is ahead of the input signal transition, half the count in the difference counter is added to the preset value.

As described above, the frequency of the $f_o$ signal is the same as the frequency of the input signal $f_{in}$, but the periods of the first and second half cycles of the $f_o$ signal are equal. This is accomplished by the flip-flop 66 that provides a $f_o$ signal at its Q output. This is accomplished by the flip-flop 66 that is set by an OR gate 68 that receives the equal signal (EQ) and the underflow signal (UF) and sets the flip-flop 66 when either the EQ or the UF signal occurs. The flip-flop 66 is reset by the comparator 54 that provides an EQ/2 signal that has a period of onehalf of the EQ signal. The EQ/2 signal is readily obtained from the comparator 54 by shifting the sampling point of the comparator 54 one stage to the right.

The timing diagram for the circuit of FIG. 3 is illustrated in FIG. 4. The graph 70 of FIG. 4A shows the input signal. FIG. 4B shows the input signal divided by two. Graph 72 of FIG. 4C shows the EQ signal that is produced by the comparator 54 when the counts in the up/down counter 52 and the preset counter 50 are equal. Graph 74 in FIG. 4D shows the underflow pulses produced each time the up/down counter 52 underflows. The graph 76 in FIG. 4E shows the EQ/2 signal. Graph 78 in FIG. 4F shows the set signal that is generated by the OR gate 68 in response to a UF or EQ input. Graph 80 in FIG. 4G shows an equal period output signal at the frequency of the input signal that is obtained by setting a set/reset flip-flop by an OR of the EQ and underflow signals and resetting it with the EQ/2 signal.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A precision demodulator, for providing a demodulated output signal in response to an input signal, comprising:

means for receiving an input signal at a predetermined frequency;

clock means including a clock for providing clock pulses;

a bi-directional counter coupled to said clock means;

control means responsive to said input signal for providing a control signal causing said bi-directional counter to count a predetermined number of pulses in a first direction in response to said input signal and an equal number of pulses in a second direction immediately thereafter; and means responsive to said control signal for providing said demodulated output signal at a substantially constant duty cycle independent of changes in the frequency of the input signal.

2. A precision demodulator as recited in claim 1, further including a phase detector having a first input coupled to said input signal receiving means, a second input coupled to said control means and an output; and a voltage controlled oscillator having an input coupled to the output of said phase detector and an output coupled to said control means.

3. A precision demodulator as recited in claim 1, further including:

means including a preset counter having a predetermined number stored therein;

means including a comparator coupled to said bi-directional counter and said preset counter for comparing said predetermined number in the preset counter with a count in the bi-directional counter when the count in the bi-directional counter is changed from said first direction to said second direction; and means for adjusting said predetermined number in the preset counter until it corresponds to the count in the bi-directional counter when the count in the bi-directional counter is changed from said first direction to said second direction.

4. A precision duty cycle tracking loop for providing an output signal having equal width first and second half cycles, comprising:

means for receiving an input signal at a predetermined frequency having full cycles comprised of first and second half cycles;

a bi-directional counter;

means for controlling said bi-directional counter responsive to said input signal for causing said bi-directional counter to count in a first direction during a full cycle of said input signal and to count an equal number of counts in a second direction immediately thereafter; and means for detecting transitions between counting directions of said bi-directional counter for providing said output signal, wherein said output signal has equal width first and second half cycles independent of the frequency of said input signal.

5. A precision duty cycle tracking loop as recited in claim 4, wherein said input signal receiving means includes a phase detector and a voltage controlled oscillator.

6. A precision duty cycle tracking loop for providing an output signal having equal width first and second half cycles, comprising:

means for receiving an input signal having full cycles comprising of first and second half cycles said input signal receiving means including a phase detector and a voltage controlled oscillator;

a bi-directional counter;

means for controlling said bi-directional counter responsive to said input signal for causing said bi-directional counter to count in a first direction during a full cycle of said input signal and to count an equal number of counts in a second direction immediately thereafter;

means for detecting transitions between counting directions of said bi-directional counter for providing said output signal; wherein said bi-directional counter provides an underflow signal when the count in the second direction has been completed and wherein said detecting means includes said control means, said control means being responsive to said voltage controlled oscillator and to said underflow signal for providing said output signal, said output signal being coupled to said phase detector for comparison with said input signal.

7. A phase lock loop comprising:

a phase detector having first and second inputs and an output that provides an output signal representative of a difference in phases of signals applied to the first and second inputs;

means for applying an input signal to said first input;

a voltage controlled oscillator having a frequency control input coupled to said output of said phase detector, said oscillator providing an oscillatory output signal;

a clock having an output providing clock pulses;

a bi-directional counter having an input coupled to said output of said clock for receiving clock pulses, a control input for selecting whether said bi-directional counter counts in a first direction or a second direction and an underflow output for providing an underflow output signal when said count has reached a predetermined value when counting in said second direction; and control means responsive to said voltage controlled oscillator and to said underflow signal, said control means providing a control signal to said bi-directional counter for changing the direction of said count.

8. A precision demodulator comprising:

means for receiving an input signal;

a bi-directional counter;

a clock;

means for applying pulses from said clock to said bi-directional counter under the control of said input signal;

a preset counter having a predetermined count stored therein;

means including a comparator coupled to said bi-directional counter and to said preset counter for comparing the counts therein and providing an equivalence signal when the counts are equal, said bi-directional counter being responsive to said equivalence signal for reversing the count from a first to a second direction, said bi-directional counter being operative to provide an underflow signal when the count in the second direction is complete, said count in the second direction being complete when the number of said counts in said second direction is the same as the number of said counts in said first direction; and means responsive to said equivalence signal and to said underflow signal for providing an output signal.

9. A method for providing a demodulated signal in response to an input signal, comprising:

receiving the input signal at a predetermined frequency;

providing clock pulses;

providing a bi-directional counter for counting said clock pulses;

providing a control signal in response to said input signal in order to cause said bi-directional counter to count a predetermined number of pulses in a first direction in response to said input signal and an equal number of pulses in a second direction immediately thereafter; and utilizing said control signal for providing said output signal at a substantially constant duty cycle independent of changes in the frequency of the input signal.

10. A method as recited in claim 9, further including utilizing a phase detector to compare the phases of said input signal and said output signal;

controlling an oscillator in response to said phase difference; and providing the control signal in response to signals from said oscillator.

11. A method as recited in claim 9, further including:

pre-setting a preset counter to a predetermined number;

comparing said predetermined number in the preset counter with the count in the bi-directional counter when the direction of the count in the bi-directional counter is changed; and adjusting the number in the preset counter until it corresponds to the count in the bi-directional counter when the direction of the count is changed.

12. a method of stabilizing a precision demodulator by feeding back a phase difference between a preset number and an actual input signal by updating the preset number by a full count error of a first cycle and then subtracting one-half of said full count error over a next cycle.

13. A method of stabilizing a precision demodulator by feeding back half a phase difference between a preset number and an actual input signal by updating the preset number by half a full count error of a first cycle and subtracting ¼ of said full count error over two subsequent cycles.

14. A method of stabilizing a precision demodulator by feeding back a portion of a phase difference between a preset number and an input signal of a predetermined frequency and subsequently feeding back a smaller portion by subtraction from the preset number over subsequent cycles independent of said frequency.

* * * * *